United States Patent [19]

Tagawa et al.

[11] Patent Number: 5,438,021
[45] Date of Patent: Aug. 1, 1995

[54] METHOD OF MANUFACTURING A MULTIPLE-CHIP SEMICONDUCTOR DEVICE WITH DIFFERENT LEADFRAMES

[75] Inventors: Tomohide Tagawa; Takashi Takahashi, Kawanishi; Takayoshi Kawasaki, Itami, all of Japan

[73] Assignee: Mitsubishi Denki Kabushiki Kaisha, Tokyo, Japan

[21] Appl. No.: 215,459

[22] Filed: Mar. 21, 1994

Related U.S. Application Data

[62] Division of Ser. No. 10,849, Jan. 29, 1993, Pat. No. 5,313,095.

[30] Foreign Application Priority Data

Apr. 17, 1992 [JP] Japan .................. 4-097859

[51] Int. Cl.$^6$ ............................................. H01L 21/28
[52] U.S. Cl. ............................. 437/207; 437/205; 437/206; 437/217; 437/220
[58] Field of Search ............... 437/205, 207, 217, 220, 437/206; 257/672, 766, 723, 676, 782, 677, 691, 724, 782

[56] References Cited

U.S. PATENT DOCUMENTS

| | | | |
|---|---|---|---|
| 4,633,582 | 1/1987 | Ching et al. | 357/70 |
| 4,794,431 | 12/1988 | Park | 357/19 |
| 5,001,545 | 3/1991 | Kalfus et al. | 437/220 |
| 5,049,527 | 9/1991 | Merrick et al. | 437/220 |
| 5,049,977 | 4/1991 | Sako | 357/72 |
| 5,057,906 | 10/1991 | Ishigami | 357/80 |
| 5,147,815 | 9/1992 | Casto | 437/51 |
| 5,313,095 | 5/1994 | Tagawa et al. | 257/672 |

FOREIGN PATENT DOCUMENTS 1137660  5/1989  Japan .

*Primary Examiner*—George Fourson
*Assistant Examiner*—Long Pham
*Attorney, Agent, or Firm*—Oblon, Spivak, McClelland, Maier & Neustadt

[57] ABSTRACT

A multiple-chip semiconductor device of the present invention comprises a first and a second leadframes. The same package envelops a power semiconductor chip mounted on a power chip mounting area in the first leadframe and a control chip mounted on a control chip mounting area in the second leadframe. In the device, the second leadframe is made of metal material which is processed easier than the first leadframe, and/or is finished thinner than the first leadframe. Thus, the multiple-chip semiconductor device can effectively dissipate the heat producing in the power semiconductor chip.

13 Claims, 8 Drawing Sheets

METHOD OF MANUFACTURING A MULTIPLE-CHIP SEMICONDUCTOR DEVICE WITH DIFFERENT LEADFRAMES

This is a division, of application Ser. No. 08/010,849, filed on Jan. 29, 1993, now U.S. Pat. No. 5,313,095.

BACKGROUND OF THE INVENTION

1. Field of the Invention

The present invention relates to a multiple-chip semiconductor device in which the same package envelops a semiconductor power chip, viz., a power transistor or a power MOSFET, and a control semiconductor chip for controlling the semiconductor power chip. The invention also relates to a method of manufacturing such a multiple-chip semiconductor device.

2. Description of the Background Art

FIGS. 1 and 2 are a plan view and a cross sectional view of a conventional multiple-chip semiconductor device, respectively. The conventional multiple-chip semiconductor device is manufactured in the following manner.

A first step of fabrication is, as shown in FIG. 1, preparation of a leadframe 5 which consists of a tiebar 1 and external leads 2 to 4 extending from the tiebar 1. Of the external leads 2 to 4, the external leads 2 and 3 respectively have at their ends mounting areas 2a and 3a which respectively mount a semiconductor power chip 6 (hereinafter "power chip") and a control semiconductor chip 7 (hereinafter "control chip") which controls the power chip 6.

The power chip 6 and the control chip 7 are then attached on the mounting areas 2a and 3a. This is followed by wiring for electrically interconnecting the external leads 2 to 4, the power chip 6 and the control chip 7 with aluminum wires 8 and gold wires 9 and subsequent transfer molding for forming a monolithic resin package 10 (FIG. 1). The external leads 2 to 4 are then severed from the tiebar 1, completing the multiple-chip semiconductor device of FIG. 2. In FIGS. 1 and 2, indicated at reference numeral 11 is a through hole.

Due to the presence of the power chip 6, how to efficiently radiate heat which is developed by the power chip 6 is an important consideration in designing the multiple-chip semiconductor device described as above. To ensure efficient heat dissipation, the leadframe 5 is customarily made of metal which has a relatively high heat conductivity, typically copper, and finished relatively thick.

The package pin counts and the chip-feature size will undoubtedly continue to increase with improvement in capabilities of the control chip 7. Hence, to satisfy the demand, it is necessary, that the leadframe 5, made of copper, is designed in tine configuration. However, the thicker the leadframe 5 the more difficult it becomes to form the leadframe 5 in fine configuration.

On the other hand, with a decrease in the leadframe thickness for easiness in fine processing, efficiency of heat radiation decreases. For multiple-chip semiconductor devices in which a thin leadframe 5 is used, serious problems arise due to heat produced in the power chip 6; the semiconductor devices will fail, or will be destructed.

The problem above is joined by another inconvenience. As described earlier two wire bonding steps, one using the aluminum wires 8 and the other using the gold wires 9, are required to fabricate the conventional multiple-chip semiconductor device. The aluminum wires 8 are used for interconnection of the power chip 6. This is because the power chip 6 is a semiconductor element which handles large power and aluminum endures large power. The gold wires 9 are used for interconnection of the control chip 7 since interconnecting using aluminum wires is not suitable for a small and delicate chip like the control chip 7. Hence, the two wire bondings need to be performed separately and serially. A result of this is a lowered manufacturing efficiency and a prolonged manufacturing time.

SUMMARY OF THE INVENTION

The present invention is directed to a method of manufacturing a multiple-chip semiconductor device in which the same package envelops a semiconductor power chip and a control semiconductor chip for controlling the semiconductor power chip. The method comprises the steps of: (a) preparing a first leadframe which has a first external lead, the first external lead includes a power chip mounting area for mounting the semiconductor power chip; (b) preparing a second leadframe which has a second external lead which includes a control chip mounting area for mounting the control semiconductor chip, the second leadframe being thinner than the first leadframe and/or made of material which is processed easier than the first leadframe; (c) mounting the semiconductor power chip on the power chip mounting area and electrically connecting the semiconductor power chip with the first leadframe; (d) mounting the semiconductor control chip on the control chip mounting area and electrically connecting the semiconductor control chip with the second leadframe; and (e) thereafter packaging the semiconductor power chip, the control semiconductor chip and the first and the second leadframes in the same package.

The present invention is also directed to a multiple-chip semiconductor device comprising: a semiconductor power chip; a control semiconductor chip for controlling the semiconductor power chip; a first leadframe having a first external lead which includes a power chip mounting area for mounting the semiconductor power chip, the first leadframe made of a first metal material; a second leadframe having a second external lead which includes a control chip mounting area for mounting the control chip, the second leadframe made of a second metal material which is processed easier than the first metal material; and a package for enveloping the semiconductor power chip which is mounted on the power chip mounting area and the control semiconductor chip which is mounted on the control chip mounting area.

In an aspect of the present invention, a multiple-chip semiconductor device comprises: a semiconductor power chip; a control semiconductor chip for controlling the semiconductor power chip; a first leadframe having a first external lead which includes a power chip mounting area for mounting the semiconductor power chip; a second leadframe having a second external lead which includes a control chip mounting area for mounting the control chip, the second leadframe finished thinner than the first leadframe; and a package for enveloping the semiconductor power chip which is mounted on the power chip mounting area and the control semiconductor chip which is mounted on the control chip mounting area.

Accordingly, it is an object of the present invention to offer a multiple-chip semiconductor device which exhibits excellent heat dissipation.

It is an object of the present invention to offer a multiple-chip semiconductor device which deals with increase in pin counts and chip size or a control semiconductor chip. It is an object of the present invention to offer a multiple-chip semiconductor device which is manufactured in a reduced time.

It is also an object of the present invention to offer a method of manufacturing such a semiconductor device.

These and other objects features, aspects and advantages of the present invention will become more apparent from the following detailed description of the present invention when taken in conjunction with the accompanying drawings.

DESCRIPTION OF THE PREFERRED EMBODIMENTS

Figure 3:
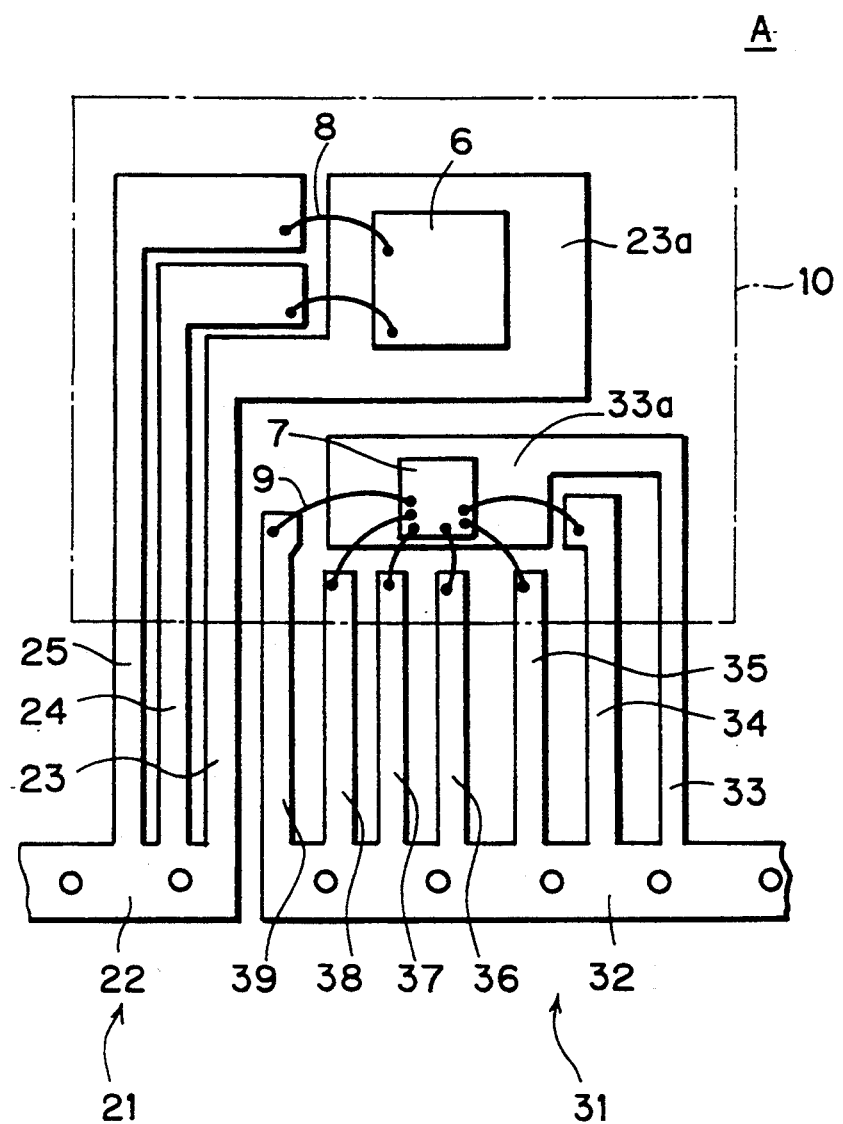
FIG. 3 is a plan view of a multiple-chip semiconductor device according to a first preferred embodiment of the present invention.

FIG. 3 is a plan view of a multiple-chip semiconductor device according to a first preferred embodiment of the present invention. The semiconductor device A of FIG. 3 is an SIP (Single In-line Package) type device. In the following, a method of manufacturing the semiconductor device A will be described while referring to design characteristics of the semiconductor device A.

Figure 4:
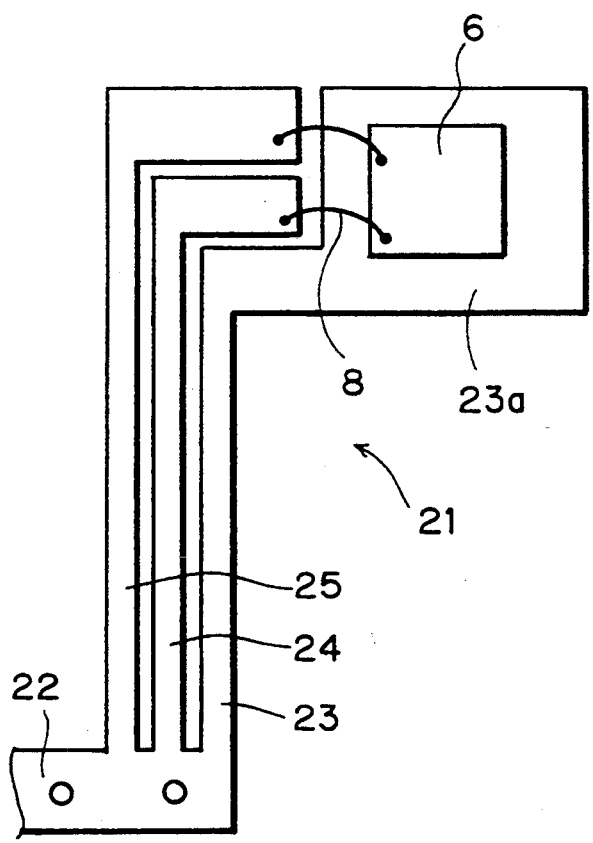
FIGS. 4 and 5 are plan views showing a method of manufacturing the multiple-chip semiconductor device of FIG. 3.
Figure 5:
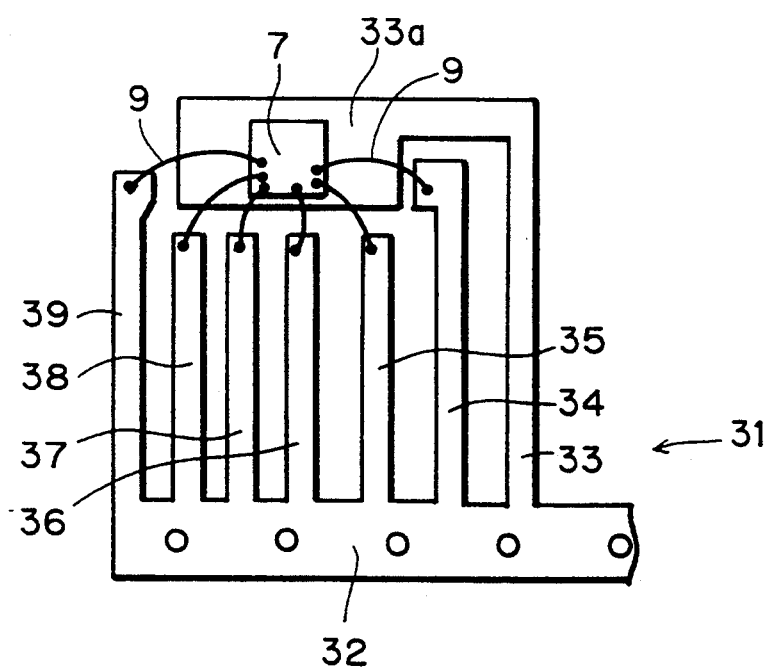

FIGS. 4 and 5 are plan views each showing a manufacturing method of the semiconductor device of the first preferred embodiment. In the first stage of the process, a leadframe 21 is prepared which is made of a metal which has a high heat conductivity such as copper (FIG. 4). From a tiebar 22 of the leadframe 21 extend external leads 23, 24 and 25. The external lead 23 has a power chip mounting area 23a on which a power chip 6 is to be mounted. Signals are transmitted to and/or from the power chip 6 through the external leads 24 and 25.

Another leadframe is prepared separately from the leadframe 21, namely, a leadframe 31 made of a metal which is processed with better ease than copper. For example, 42-alloy (42% nickel and 58% iron) is a suitable material for the leadframe 31. The leadframe 31 consists of a tiebar 32 and seven external leads 33 to 39 extending from the tiebar 32. The end portion of the external lead 33 is a mounting area 33a for mounting a control chip 7. The leadframe 31 may be otherwise made of phosphorus bronze or coval ("Coval" is a product name; consists of 54% iron, 29% nickel and 17% cobalt).

Figure 1:
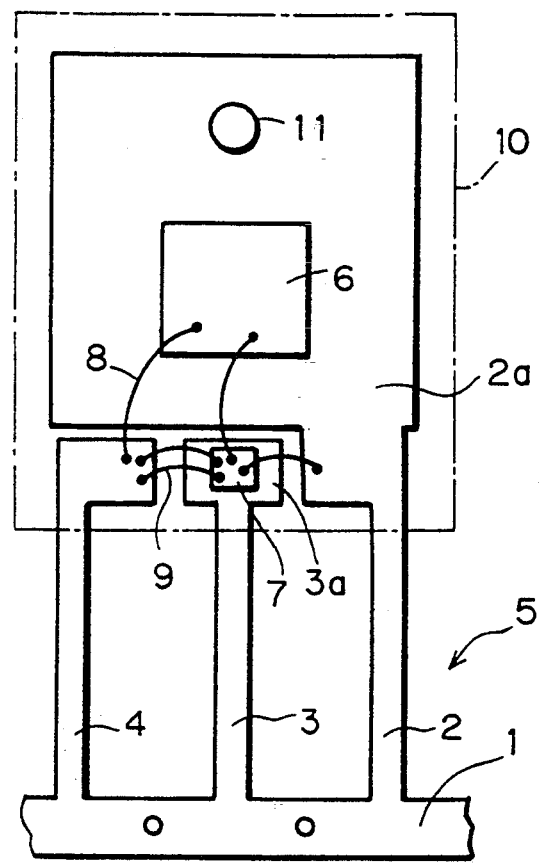
FIG. 1 is a plan view of a conventional multiple-chip semiconductor device.
Figure 2:
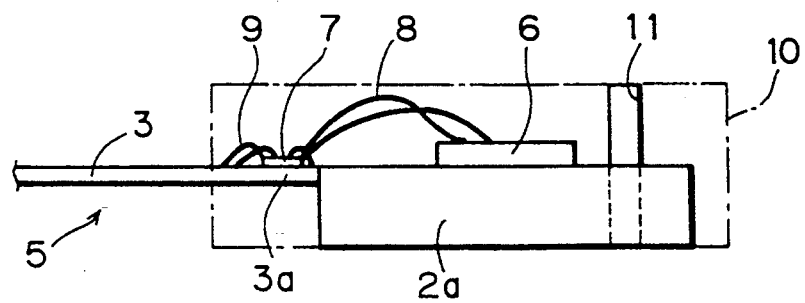
FIG. 2 is a cross sectional view of the conventional multiple-chip semiconductor device of FIG. 1.

The leadframes 21 and 31 are quite distinctive from each other not only in metallic material forming them but also in thickness. Although not illustrated in FIG. 2, while the leadframe 21 is formed relatively thick considering heat dissipation, the leadframe 31 is finished thin, placing priority on easiness of processing.

Next, the power chip 6 and the control chip 7 are separately and simultaneously assembled. That is, the power chip 6 is mounted on the power chip mounting area 23a and then electrically connected with one ends of the external leads 24 and 25 by the aluminum wires 8 (FIG. 4). Concurrently with this, the control chip 7 is mounted on the control chip mounting area 33a and electrically connected with one ends of the external leads 34 to 39 by the gold wires 9 (FIG. 5).

The leadframe 21 thus mounting the power chip 6 (FIG. 4) and the leadframe 31 thus mounting the control chip 7 (FIG. 5) are thereafter aligned to each other, immediately followed by that the monolithic resin package 10 is transfer molded (FIG. 3). The external leads 23 to 25 and 33 to 39 are then cut at their other ends, separating the device from the leadframes 21 and 31. Thus, the SIP type semiconductor device A is completed.

As hereinabove described, the first preferred embodiment ensures efficient radiation of heat which is generated by the power chip 6 since the power chip 6 is mounted on a leadframe which is excellent in heat dissipation (i.e., which has a high heat conductivity), namely, the thick leadframe 21. On the other hand, being made of metal which is easily processed and which is finished thin, the leadframe 31 for mounting the control chip 7 is easily processed in detail. This makes it possible that the leadframe 31 has fine configuration, which in turn allows that the device is adaptive to the control chip 7 with higher pin counts and increased chip size. Similar effect is attainable only if the leadframe 31 is made of a metallic material which is processed easier than the leadframe 21. Otherwise, the leadframe 31 needs not to be made of a metal which is processed easier than the leadframe 21 only if finished thinner than the leadframe 21, since the effect as above is nevertheless promised. However, to obtain better effect, it is preferred that the leadframe 31 is made of a process-easy metallic material and finished thinner than the leadframe 21 as required in the first preferred embodiment.

Another effect of the first preferred embodiment is substantial reduction in manufacturing time of the semiconductor device. The reduction is achieved because the power chip 6 and the control chip 7 are assembled concurrently.

Figure 6:
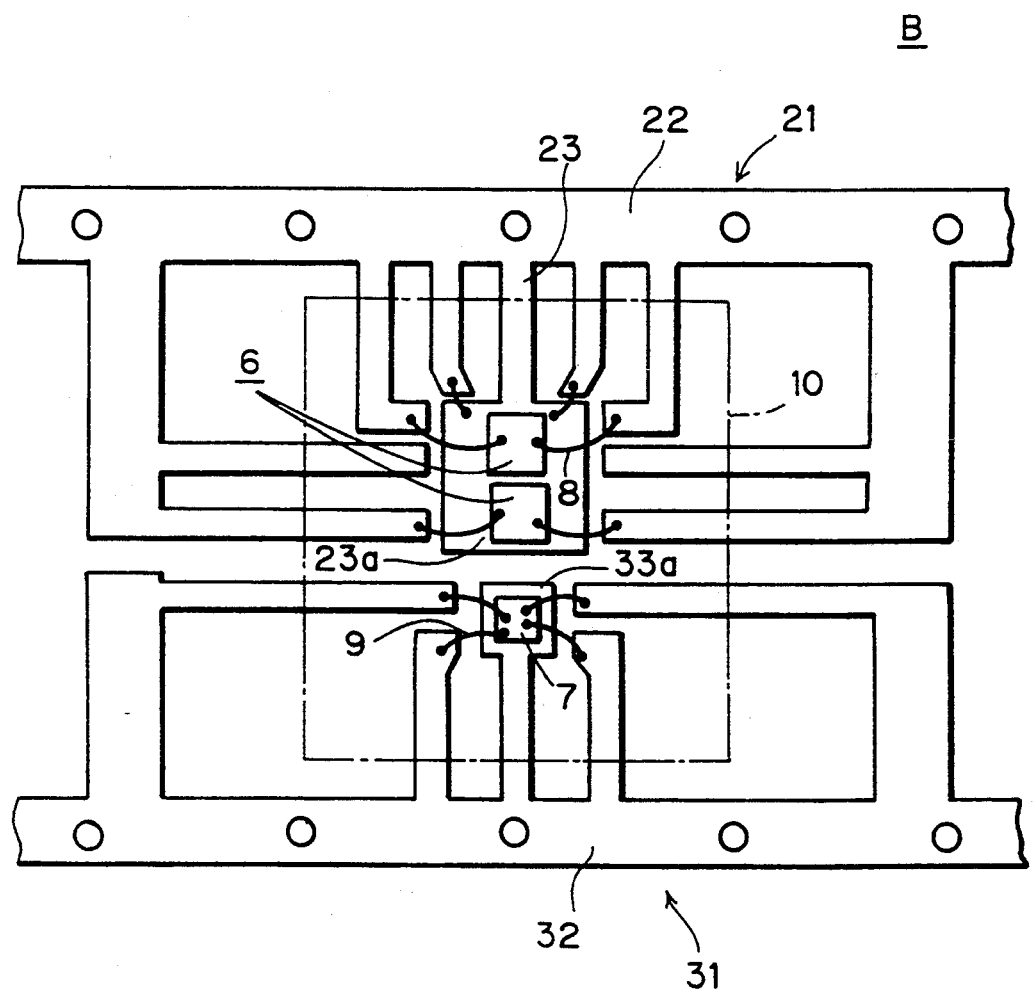
FIG. 6 is a plan view of a multiple-chip semiconductor device according to a second preferred embodiment of the present invention.

FIG. 6 is a plan view of a multiple-chip semiconductor device according to a second preferred embodiment of the present invention. The semiconductor device B is a QFP (=Quad Flat Package) type device. The second preferred embodiment is different from the first preferred embodiment in that the power chip mounting area 23a mounts two power chips 6 and 6. In addition, the second preferred embodiment requires that external leads extend all around the chips whereas the external leads extend in the same direction in the first preferred embodiment. The semiconductor devices of the two preferred embodiments are otherwise generally similar to each other, and so are the manufacturing methods of the same (se below).

A first step of fabrication of the semiconductor device B is to punch out the leadframe 21, which is to mount the power chip 6, from a relatively thick copper plate. This is similar to the first preferred embodiment. Simultaneous with this, the leadframe 31 for mounting the control chip 7 is fine processed from a 42-alloy plate. Hence, likewise as in the first preferred embodiment, the second preferred embodiment also ensures that the leadframe 21 is excellent in heat dissipation and the leadframe 31 is processed finer in an easy manner.

Next, the power chips 6 and 6 are mounted on the power chip mounting area 23a of the leadframe 21 and then electrically connected with associated external leads by the aluminum wires 8. This assembly operation is performed simultaneously with an assembly operation on the leadframe 31; that is, the control chip 7 is mounted on the control chip mounting area 33a of the leadframe 31 and wire bonded with suitable external leads by the gold wires 9. Thus, the two assembly operations are preformed at the same time as they are in the first preferred embodiment. Hence, the second preferred embodiment makes it possible to the shorten manufacturing time of the semiconductor device.

Upon the assembly operations, the leadframe 21 now mounting the power chips 6 and 6 and the leadframe 31 now mounting the control chip 7 are aligned to each other. Then, the monolithic resin package 10 is transfer molded and the external leads are cut at the other ends so that the semiconductor device is separated from the leadframes 21 and 31. This concludes fabrication of the QFP type semiconductor device B.

Figure 7:
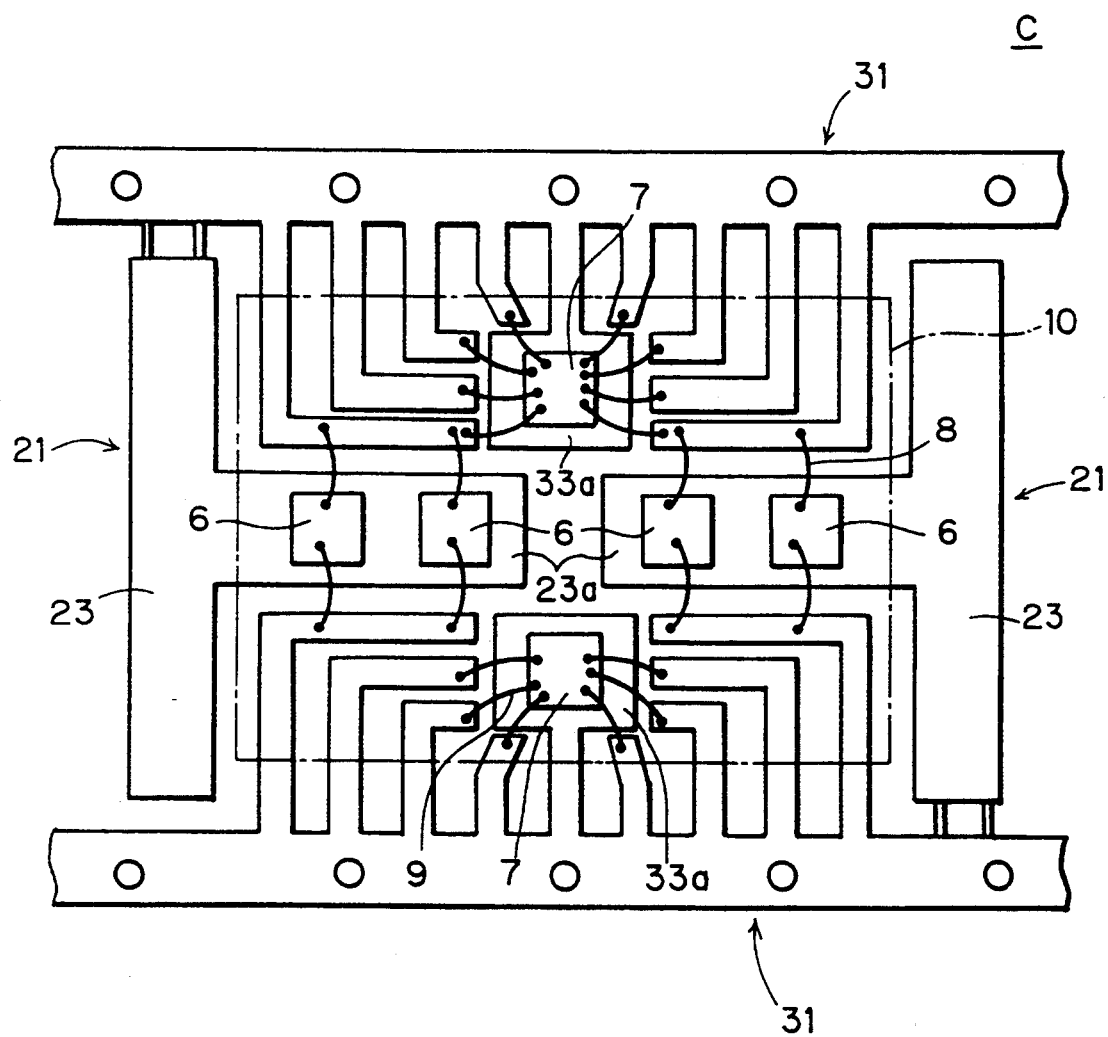
FIG. 7 is a plan view of a multiple-chip semiconductor device according to still other preferred embodiment of the present invention.

The foregoing is related to where the present invention is applied to the SIP type and the QFT type semiconductor devices. It is to be noted that other applications of the present invention are not prohibited. For instance, a DIP (Dual In-line Package) type semiconductor device C as shown in FIG. 7 is also within the boundary of the possible applications of the invention. The semiconductor device C is generally the same as the semiconductor devices A and B in terms of structure manufacturing method and effect. Hence, similar symbols and reference numbers are allotted to the corresponding parts, by which the structure the manufacturing method and the effect of the semiconductor device C are regarded as explained.

Figure 8:
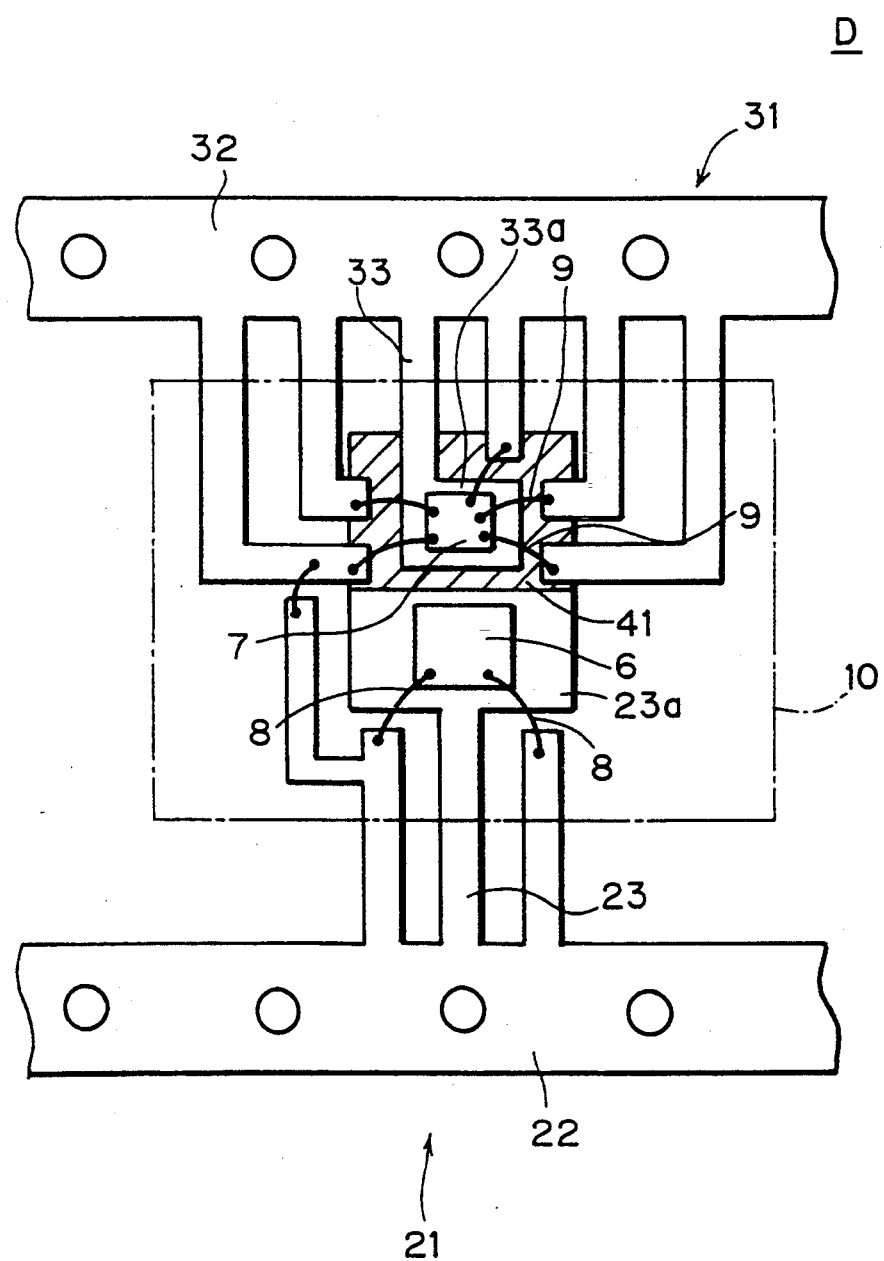
FIG. 8 is a plan view showing an expedient of the multiple-chip semiconductor devices of the present invention.
Figure 9:
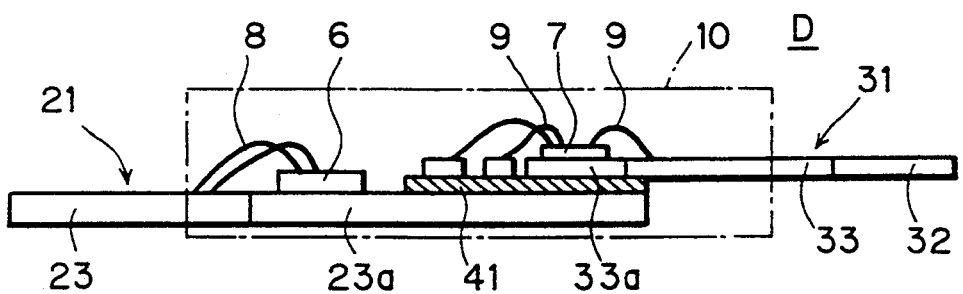
FIG. 9 is a cross sectional view of the multiple-chip semiconductor device of FIG. 8.

FIGS. 8 and 9 are a plan view and a cross sectional view, respectively, showing an expedient of the multiple-chip semiconductor devices of the present invention. In the improved semiconductor device D, an insulation sheet 41 is placed on a portion of the power chip mounting area 23a which is not covered with the power chip 6. The insulation sheet 41 mounts end portions of external leads, including the control chip mounting area 33a of the leadframe 31. Hence, the semiconductor device C is smaller than semiconductor devices of the first and the second preferred embodiment without such structure.

Figure 10:
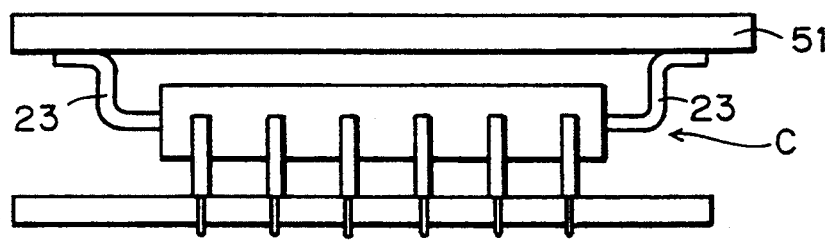
FIG. 10 is a plan view showing other expedient of the multiple-chip semiconductor devices of the present invention.
Figure 11:
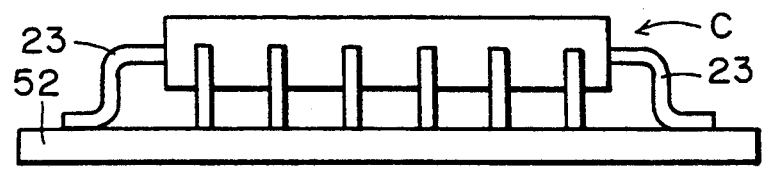
FIG. 11 is a plan view showing still other expedient of the multiple-chip semiconductor devices of the present invention.

The semiconductor device C will have enhanced heat dissipation capability if the lead 23 (which is connected with the power chip 6) is bent in an opposite direction to the elongating direction of the other leads and connected with a metal heat sink 51 (FIG. 10). The lead 23 may be otherwise bent in the same direction as the other leads (FIG. 11) and attached to a metal substrate 52 which has a high heat conductivity, to thereby produce the same result. In either case, heat developed in the power chip 6 flows to the metal heat sink 51 or the metal substrate 52 through the external leads to migrate outside.

While the invention has been described in detail, the foregoing description is in all aspects illustrative and not restrictive. It is understood that numerous other modifications and variations can be devised without departing from the scope of the invention.

We claim:

1. A method of manufacturing a multiple-chip semiconductor device in which the same package envelops a semiconductor power chip and a control semiconductor chip for controlling said semiconductor power chip, comprising the steps of:
   (a) preparing a first leadframe which has a first external lead, said first external lead includes a power chip mounting area for mounting said semiconductor power chip;
   (b) preparing a second leadframe which has a second external lead which includes a control chip mounting area for mounting said control semiconductor chip said second leadframe being thinner than said first leadframe;
   (c) mounting said semiconductor power chip on said power chip mounting area and electrically connecting said semiconductor power chip with said first leadframe;
   (d) mounting said semiconductor control chip on said control chip mounting area and electrically connecting said semiconductor control chip with said second leadframe; and
   (e) thereafter packaging said semiconductor power chip, said control semiconductor chip and said first and said second leadframes in the same package.

2. The method of claim 1, wherein another step is performed before said step (e), said another step involving disposing an insulation sheet on a portion of said power chip mounting area which is not covered with said semiconductor power chip and thereafter aligning said first and said second leadframes in such a manner that said control chip mounting area is aligned over said insulation sheet.

3. The method of claim 1, wherein said step (b) is performed simultaneously with said step (a).

4. The method of claim 1, further comprising the steps of:
   (f) bending the first external lead in a direction substantially perpendicular to a direction of elongation of said first external lead; and
   (g) connecting said bent first external lead with a heat dissipation member.

5. a method of manufacturing a multiple-chip semiconductor device in which the same package envelops a semiconductor power chip and a control semiconductor chip for controlling said semiconductor power chip, comprising the steps of:
   (a) preparing a first leadframe which has a first external lead, said first external lead includes a power chip mounting area for mounting said semiconductor power chip;
   (b) preparing a second leadframe which has a second external lead which includes a control chip mounting area for mounting said control semiconductor chip, said first leadframe being made of a material which has a higher thermal conductivity than said second leadframe;

(c) mounting said semiconductor power chip on said power chip mounting area and electrically connecting said semiconductor power chip with said first leadframe;

(d) mounting said semiconductor control chip on said control chip mounting area and electrically connecting said semiconductor control chip with said second leadframe; and (e) thereafter packaging said semiconductor power chip, said control semiconductor chip and said first and said second leadframes in the same package.

6. The method of claim 5, wherein another step is performed before said step (e), said another step involving disposing an insulation sheet on a portion of said power chip mounting area which is not covered with said semiconductor power chip and thereafter aligning said first and said second leadframes in such a manner that said control chip mounting area is aligned over said insulation sheet.

7. The method of claim 5 wherein said step (b) is performed simultaneously with said step (a).

8. The method of claim 5, further comprising the steps of:

(f) bending said first external lead in a direction substantially perpendicular to a direction of elongation of said first external lead; and (g) connecting said bent first external lead with a heat dissipation member.

9. A method of manufacturing a multiple-chip semiconductor device in which the same package envelops a semiconductor power chip and a control semiconductor chip for controlling said semiconductor power chip, comprising the steps of:

(a) preparing a first leadframe which has a first external lead, said first external lead includes a power chip mounting area for mounting said semiconductor power chip;

(b) preparing a second leadframe which has a second external lead which includes a control chip mounting area for mounting said control semiconductor chip, said second leadframe being thinner than said first leadframe and being formed of a different material than said first leadframe;

(c) mounting said semiconductor power chip on said power chip mounting area and electrically connecting said semiconductor power chip with said first leadframe;

(d) mounting said semiconductor control chip on said control chip mounting area and electrically connecting said semiconductor control chip with said second leadframe; and (e) thereafter packaging said semiconductor power chip, said control semiconductor chip and said first and said second leadframes in the same package.

10. The method according to claim 9, wherein the material of said first leadframe has a higher thermal conductivity than said second leadframe.

11. The method of claim 9, wherein another step is performed before said step (e), said step involving disposing an insulation sheet on a portion of said power chip mounting area which is not covered with said semiconductor power chip and thereafter aligning said first and said leadframes in such a manner that said control chip mounting area is aligned over said insulation sheet.

12. The method of claim 9, wherein said step (b) is performed simultaneously with said step (a).

13. The method of claim 9, further comprising the steps of:

(f) bending said first external lead in a direction substantially perpendicular to a direction of elongation of said first external lead; and (g) connecting said bent first external lead with a heat dissipation member.

* * * * *

UNITED STATES PATENT AND TRADEMARK OFFICE
CERTIFICATE OF CORRECTION

PATENT NO. : 5,438,021
DATED : August 1, 1995
INVENTOR(S) : Tomohide TAGAWA, et al.

It is certified that error appears in the above-indentified patent and that said Letters Patent is hereby corrected as shown below:

On the title page, Item [75], the third inventor's name should read:

--Takayoshi Kawakami--

On the title page, Item [54] and Column 1, Lines 2-4, the title should read:

--METHOD OF MANUFACTURING A MULTI-CHIP SEMICONDUCTOR DEVICE WITH DIFFERENT LEADFRAMES--

Signed and Sealed this

Twenty-sixth Day of September, 1995

*Attest:*

BRUCE LEHMAN

*Attesting Officer*     *Commissioner of Patents and Trademarks*